(12) United States Patent
Lin et al.

(10) Patent No.: US 10,115,581 B2
(45) Date of Patent: Oct. 30, 2018

(54) REMOVAL OF PARTICLES ON BACK SIDE OF WAFER

(71) Applicant: TAIWAN SEMICONDUCTOR MANUFACTURING COMPANY, LTD., Hsin-Chu (TW)

(72) Inventors: Hsun-Peng Lin, Nanzhuang Township, Miaoli County (TW); Hsin-Kuo Chang, Hsinchu (TW); Han-Chih Chung, Pingzhen (TW); Yueh-Chih Wang, Zhudong Township, Hsinchu County (TW); Chi-Jen Hsieh, Toufen Township, Miaoli County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/295,731

(22) Filed: Oct. 17, 2016

(65) Prior Publication Data

US 2017/0040155 A1  Feb. 9, 2017

Related U.S. Application Data

(62) Division of application No. 13/275,492, filed on Oct. 18, 2011.

(51) Int. Cl.
*B08B 7/00* (2006.01)
*B08B 7/04* (2006.01)
(Continued)

(52) U.S. Cl.
CPC .......... *H01L 21/0209* (2013.01); *B08B 1/002* (2013.01); *B08B 15/04* (2013.01);
(Continued)

(58) Field of Classification Search
CPC ............. H01L 23/544; H01L 21/02057; H01L 21/02087; H01L 21/0209; H01L 21/67046;
(Continued)

(56) References Cited

U.S. PATENT DOCUMENTS 5,475,889 A * 12/1995 Thrasher ................... B08B 1/04
15/77
5,685,039 A * 11/1997 Hamada .................. A46B 13/04
15/102

(Continued)

*Primary Examiner* — Alexander Markoff
(74) *Attorney, Agent, or Firm* — Haynes and Boone, LLP

(57) ABSTRACT

The present disclosure provides a method of cleaning a semiconductor wafer during a process of fabricating a semiconductor device. The method includes loading a semiconductor wafer into a wafer handling system. The method includes removing contaminant particles from an edge region of the wafer from the back side, wherein alignment marks are located in the edge region. The method includes collecting the removed contaminant particles and discarding the collected contaminant particles out of the wafer handling system. The disclosure also provides an apparatus for fabricating a semiconductor device. The apparatus includes a wafer cleaning device that is operable to clean a predetermined region of the wafer on the back surface thereof. The predetermined region of the wafer at least partially overlaps with one or more alignment marks.

20 Claims, 7 Drawing Sheets

(51) Int. Cl.
*H01L 21/02* (2006.01)
*H01L 21/67* (2006.01)
*H01L 21/68* (2006.01)
*H01L 23/544* (2006.01)
*B08B 1/00* (2006.01)
*B08B 15/04* (2006.01)

(52) U.S. Cl.
CPC .. *H01L 21/02057* (2013.01); *H01L 21/02087* (2013.01); *H01L 21/67046* (2013.01); *H01L 21/68* (2013.01); *H01L 23/544* (2013.01); *H01L 2223/5442* (2013.01); *H01L 2223/54426* (2013.01); *H01L 2223/54453* (2013.01); *H01L 2924/0002* (2013.01)

(58) Field of Classification Search
CPC ..... H01L 2924/0002; H01L 2223/5442; H01L 2223/54426; H01L 2223/54453; H01L 21/68; H01L 2924/00; B08B 1/002; B08B 15/04
See application file for complete search history.

(56) References Cited

U.S. PATENT DOCUMENTS

| | | |
|---|---|---|
| 6,059,891 A | 5/2000 | Kubota et al. |
| 2002/0173872 A1* | 11/2002 | Malik ................ B24B 37/04 700/164 |
| 2003/0000550 A1* | 1/2003 | Middendorf ............ B08B 1/04 134/6 |
| 2003/0184720 A1 | 10/2003 | Heerens et al. |
| 2006/0060213 A1 | 3/2006 | Huber et al. |
| 2007/0159615 A1 | 7/2007 | Horiuchi et al. |
| 2008/0163899 A1* | 7/2008 | Takiguchi ......... H01L 21/67028 134/30 |
| 2009/0113656 A1* | 5/2009 | Yoon ................. H01L 21/67046 15/302 |
| 2009/0202951 A1* | 8/2009 | Yamamoto ............ G03F 7/168 430/322 |
| 2009/0211040 A1* | 8/2009 | Shibukawa ....... H01L 21/67046 15/21.1 |
| 2012/0014689 A1 | 1/2012 | Ookouchi et al. |
| 2012/0024317 A1* | 2/2012 | Kitamura ............. B24B 53/017 134/6 |
| 2013/0092186 A1 | 4/2013 | Lin et al. |

* cited by examiner

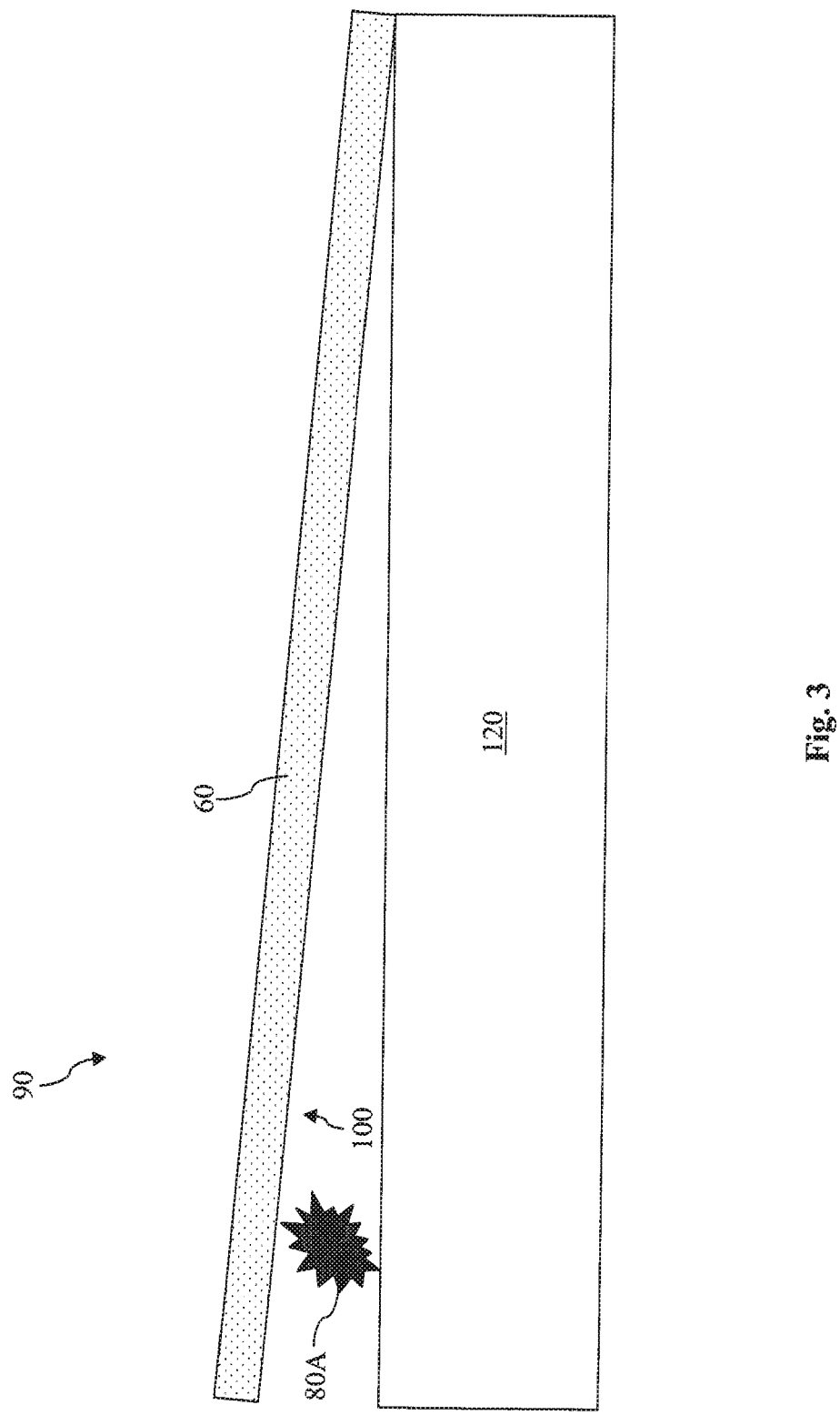

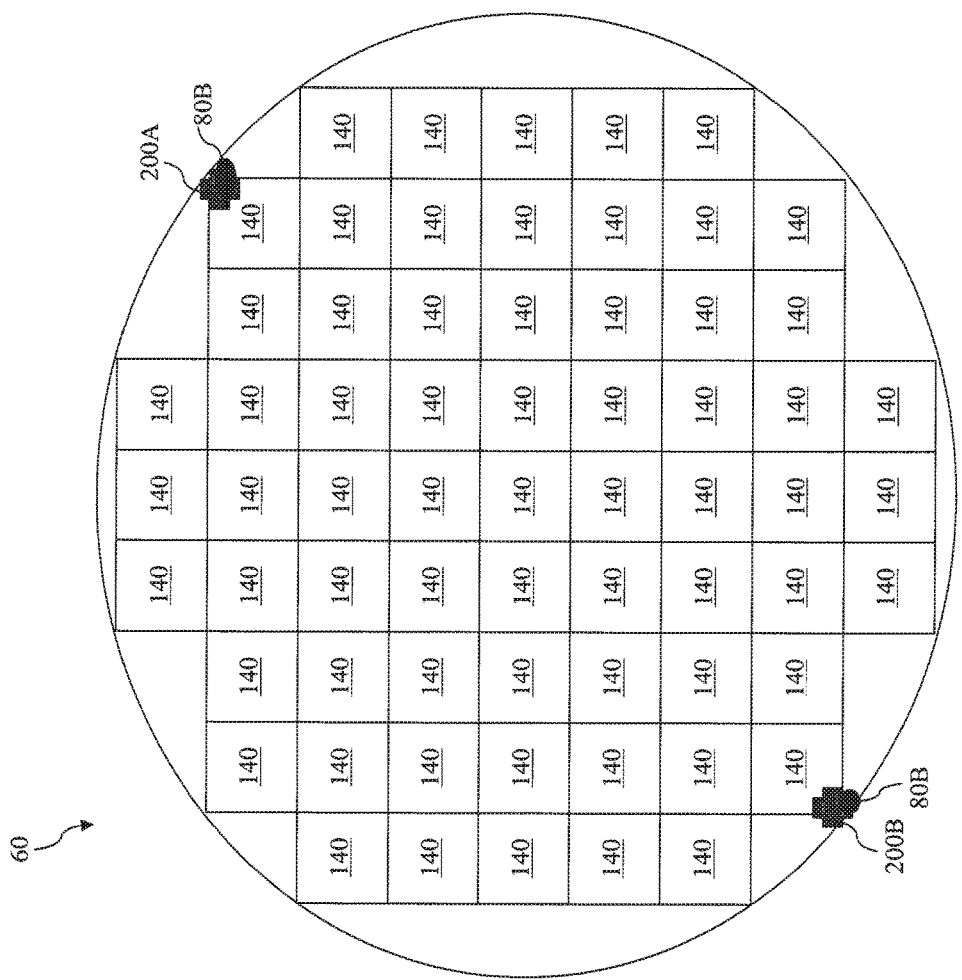

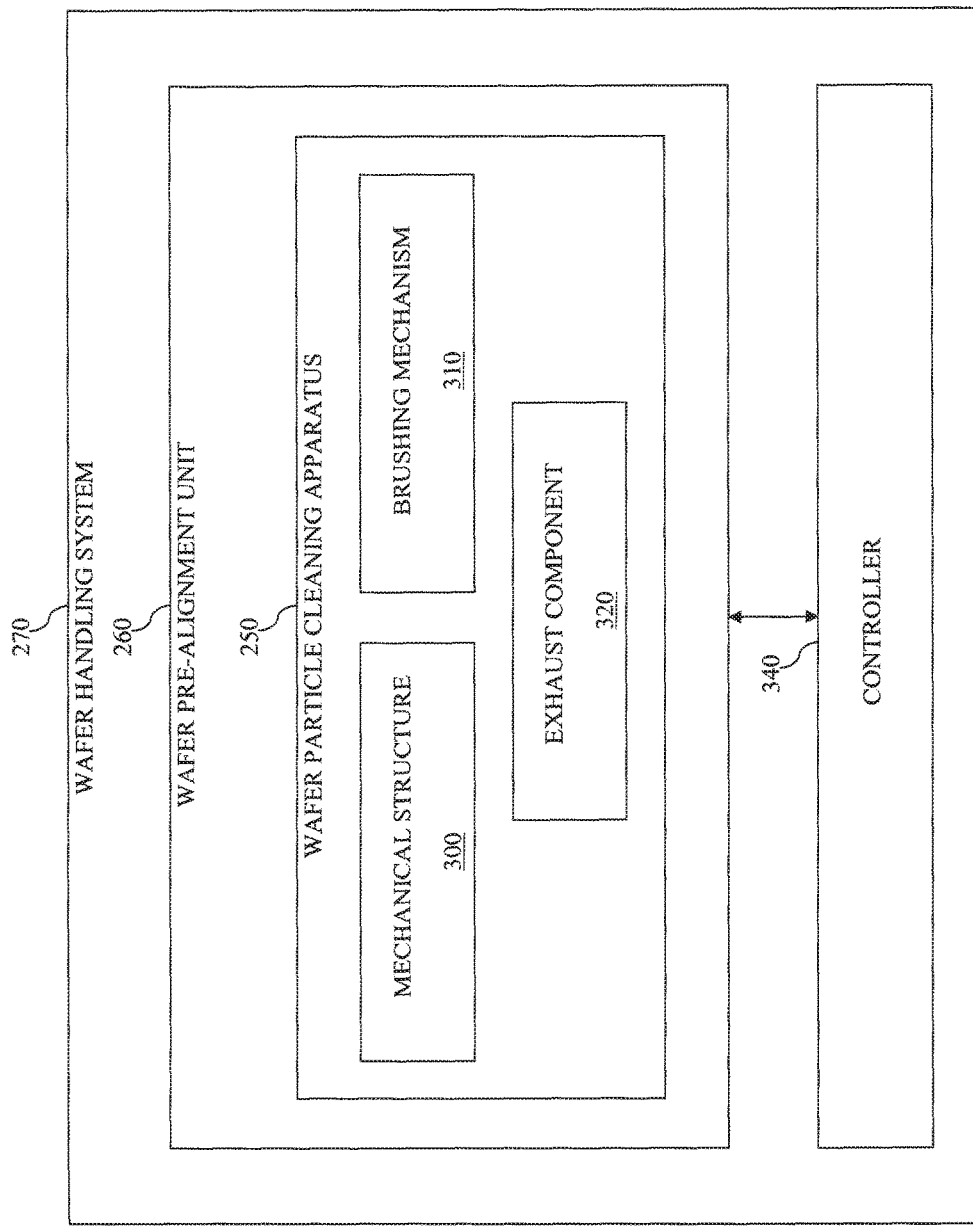

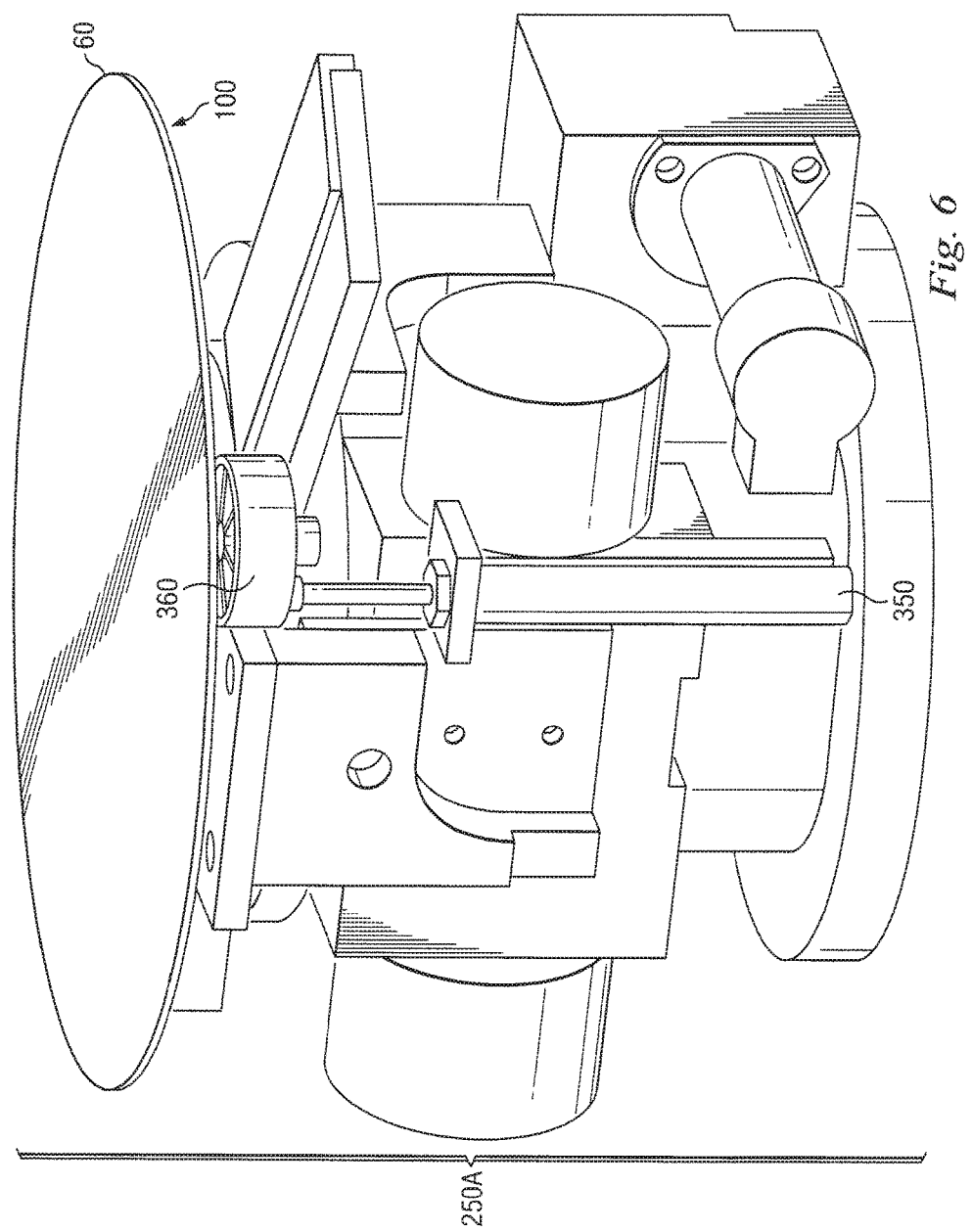

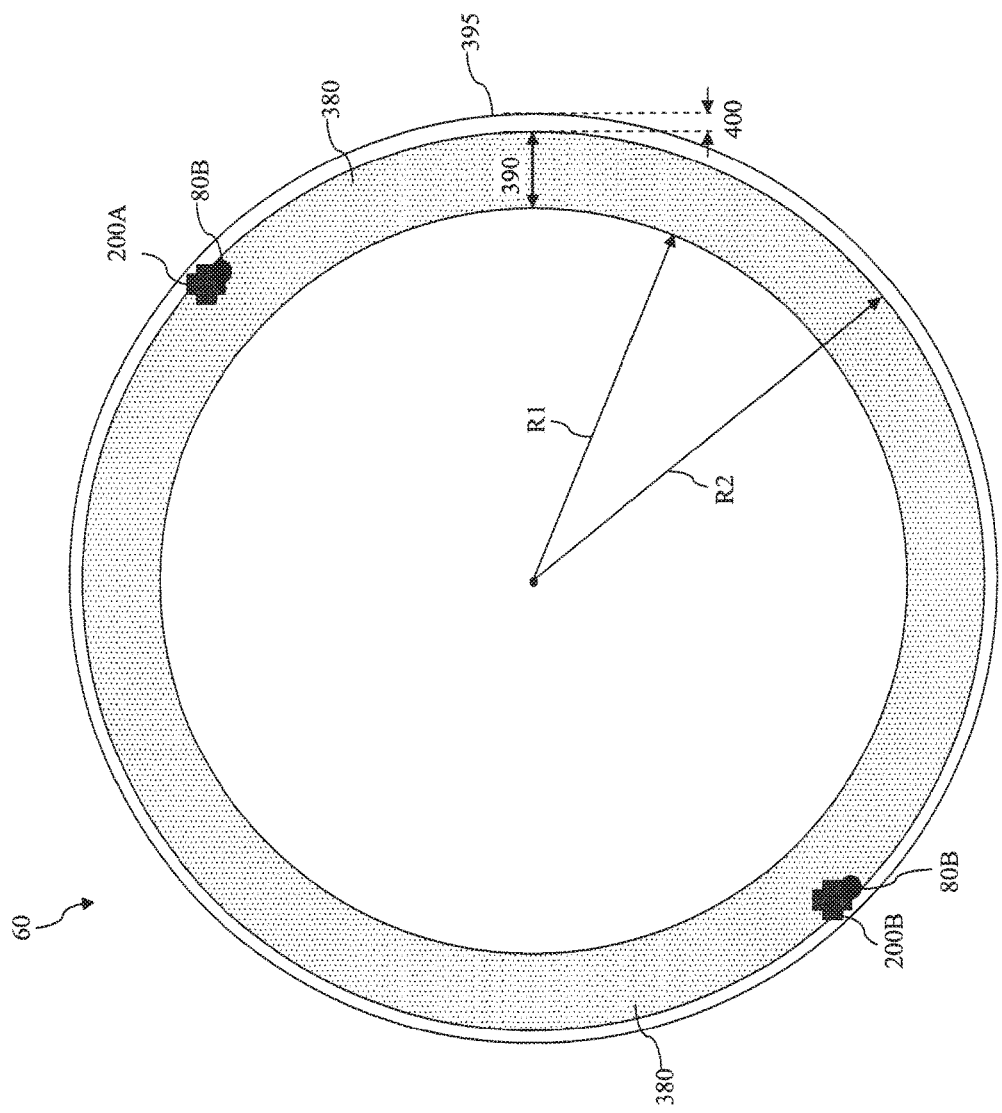

REMOVAL OF PARTICLES ON BACK SIDE OF WAFER

PRIORITY DATA

The present application is a divisional application of U.S. application Ser. No. 13/275,492, filed Oct. 18, 2011, which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As the scaling down process continues to advance, alignment and overlay issues become more important due to the ever-decreasing device sizes. A small alignment or overlay error during fabrication may lead to the failure of a wafer. In conventional semiconductor fabrication processes, various devices and techniques have been utilized to minimize misalignment during fabrication. For example, alignment marks may be used to ensure correct alignment between wafers as they are loaded into a semiconductor fabrication tool. As another example, a wafer leveling system may be used to ensure the wafer is flat during fabrication. However, particles generated by various fabrication processes may still cause alignment problems for conventional semiconductor fabrication processes, particularly if these particles are located on a back side of a wafer edge region. Consequently, the conventional semiconductor fabrication processes may produce failed wafers from time to time, thereby lowering yield and increasing fabrication costs.

Therefore, while existing semiconductor fabrication processes have been generally adequate for their intended purposes, they are not entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2-3 are simplified diagrammatic cross-sectional side views of a semiconductor wafer according to various aspects of the present disclosure.

FIG. 4 is a diagrammatic top view of a semiconductor wafer according to various aspects of the present disclosure.

FIG. 5 is a simplified block diagram of a wafer cleaning apparatus according to various aspects of the present disclosure.

FIG. 6 is a simplified perspective view of a wafer cleaning apparatus according to various aspects of the present disclosure.

FIG. 7 is a diagrammatic top view of a semiconductor wafer according to various aspects of the present disclosure.

DETAILED DESCRIPTION

Figure 1:
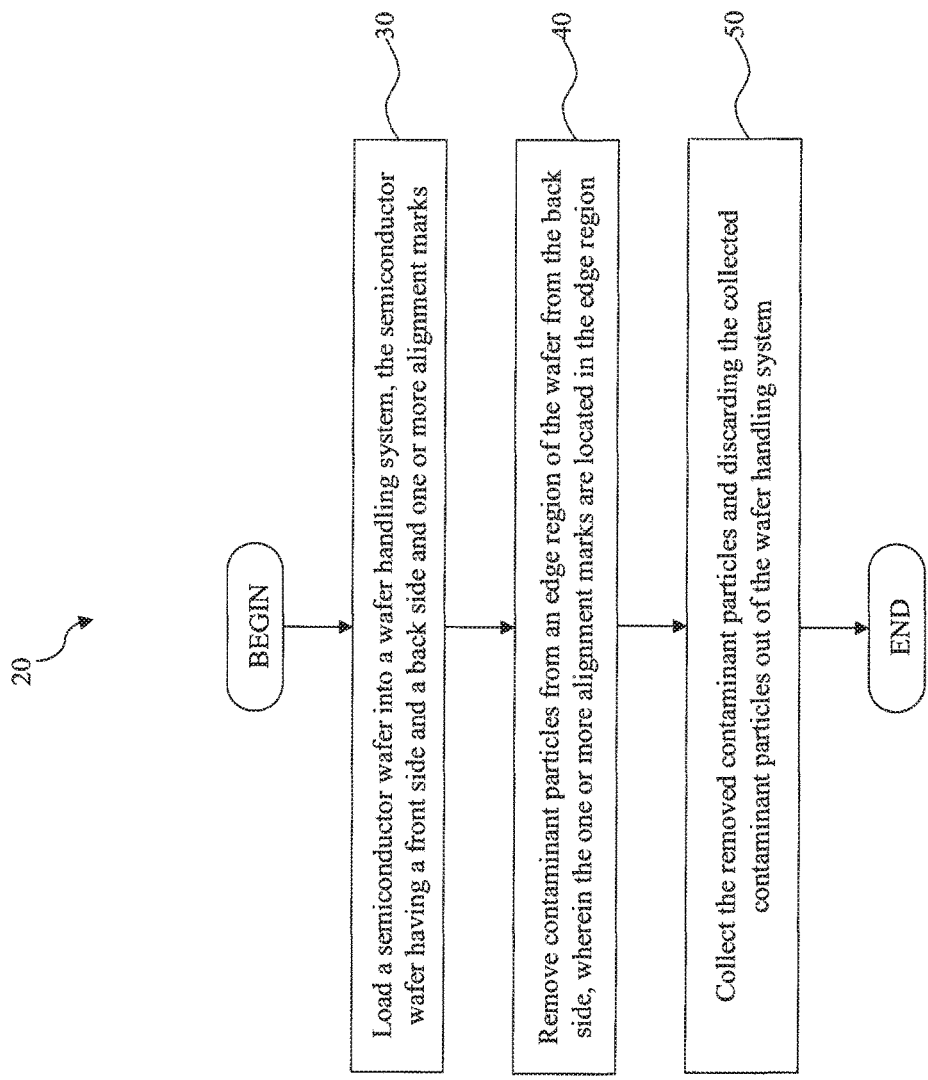
FIG. 1 is a flowchart illustrating a method for performing a wafer cleaning process according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 20 for cleaning a semiconductor wafer. The semiconductor wafer may be contain integrated circuit (IC) chips, systems on chip (SoC), or portion thereof, that may each include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Referring to FIG. 1, the method 20 includes a block 30 in which a semiconductor wafer is loaded into a wafer handling system. The semiconductor wafer has a front side and a back side and one or more alignment marks. In some embodiments, the wafer is loaded into a wafer pre-alignment unit of the wafer handling system. The method 20 includes a block 40 in which contaminant particles are removed from an edge region of the wafer from the back side. The one or more alignment marks are located in the edge region. In some embodiments, the particles are removed by brushing the edge region using an anti-electrostatic brush while the wafer is being spun. The method 20 includes a block 50 in which the removed contaminant particles are collected, and then the collected particles are discarded out of the wafer handling system. In some embodiments, the contaminant particles are sucked into an exhaust pipe. In certain embodiments, the edge region of the wafer is shaped as an annular ring having a predetermined width. An outer boundary of the annular ring is spaced apart from an outer rim of the wafer by a predetermined distance. It should be noted that additional processes may be provided before, during, and after the method 20 of FIG. 1, and that some other processes may only be briefly described herein.

Figure 2:
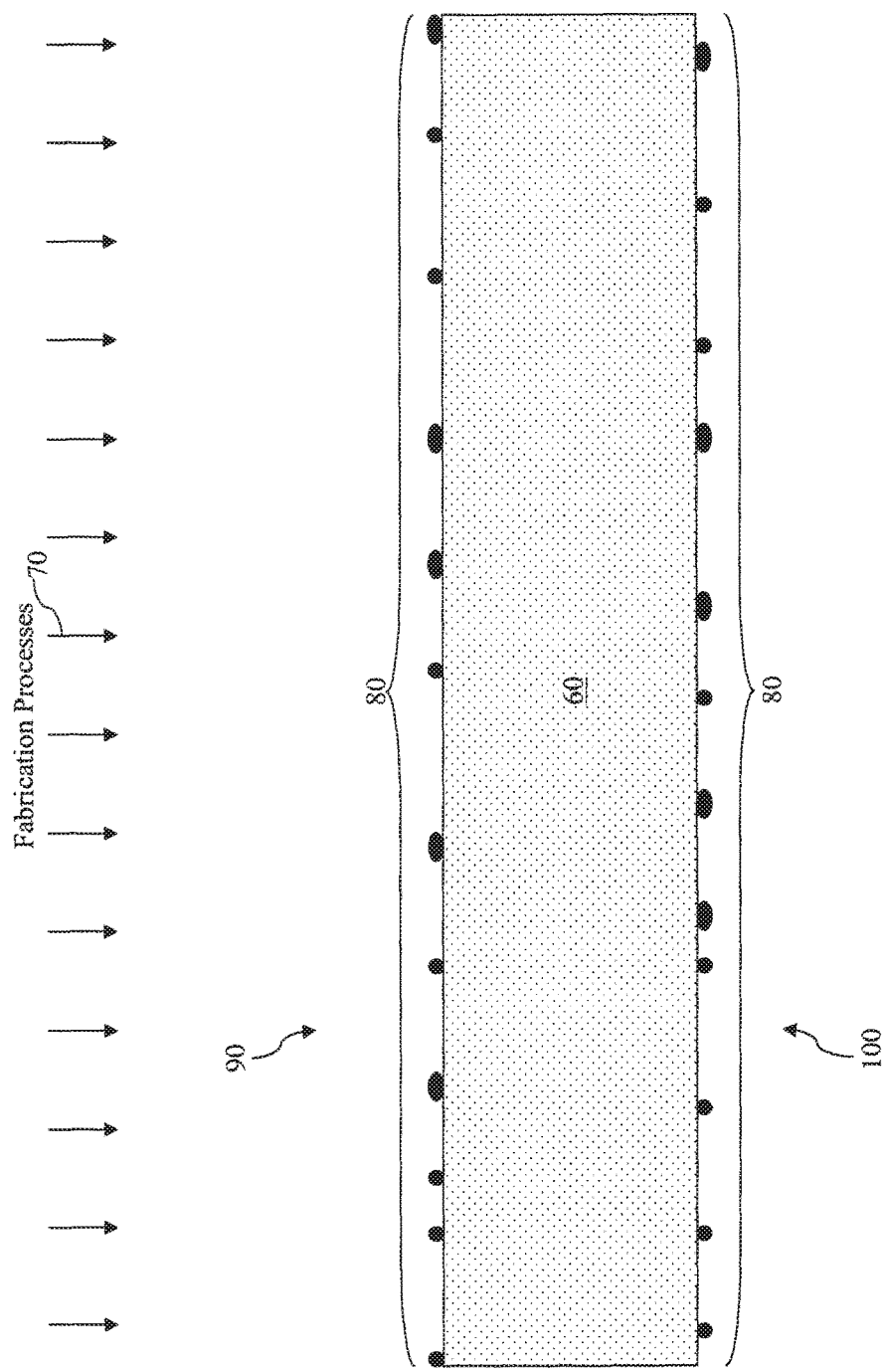

FIG. 2 is a diagrammatic fragmentary cross-sectional side view of a portion of a semiconductor device during a fabrication stage. Referring to FIG. 2, the semiconductor device includes a wafer 60, which may also be referred to as a substrate. In some embodiments, the wafer 60 may include a silicon material. In other embodiments, the wafer 60 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In various embodiments, the wafer 60 includes various doped features for various microelectronic components, such as complementary metal-oxide-semiconductor field-effect transistors (CMOSFETs), imaging sensors, memory cells, capacitive elements, inductive elements, and resistive elements.

During the course of semiconductor fabrication, a plurality of semiconductor fabrication processes 70 may be performed on the wafer 60, for example to form the various components therein. As examples, these fabrication processes 70 may include various lithography process, deposition processes, etching processes, polishing, annealing processes, rinsing processes, implantation processes, etc. The performance of these fabrication processes 70 may result in the formation of a plurality of contaminant particles 80. As examples, these contaminant particles 80 may include silicon dust, silicon oxide, or remnants of metal film, etc. As shown in FIG. 2, these contaminant particles 80 may have various shapes or sizes and may be formed in various regions of the wafer 60. The contaminant particles 80 may also be formed on either (or both) a front side (front surface) 90 of the wafer 60 or a back side 100 (back surface) of the wafer 60, where the front side 90 is a side on which most fabrication processes (such as lithography or etching processes) are performed.

The particles 80 are undesirable for a number of reasons. For example, they may cause delamination, incomplete film growth, leakage, misalignment, or otherwise degrade purity and integrity of the components of the wafer 60. As such, it is desirable to remove these contaminant particles 80 from the wafer 60. For the contaminant particles 80 located on the front side 90 of the wafer 60, they are removed relatively easily using various available cleaning processes and cleaning tools. Therefore, the contaminant particles 80 formed on the front side 90 of the wafer 60 typically will not cause big problems. On the other hand, many semiconductor fabrication processes lack adequate tools or techniques to effectively remove contaminant particles 80 on the back side 100 of the wafer 60. Hence, it is quite possible that the contaminant particles 80 on the back side 100 of the wafer 60 may remain for subsequent semiconductor fabrication processes. The presence of these back side contaminant particles may cause problems, particularly alignment-related problems.

In an effort to overcome this problem, various tools and techniques may be used to substantially mitigate the problems caused by contaminant particles 80 formed on the back side 100. For example, one problem caused by the presence of the contaminant particles 80 on the back side 100 of the wafer 60 is that the wafer 60 may be tilted. This is illustrated in FIG. 3, which is a simplified cross-sectional side view of the wafer 60 and a wafer-holding device 120. As shown in FIG. 3, the wafer 60 is located on the wafer-holding device 120. The wafer holding-device may be a chuck in some embodiments, such as an electronic chuck. Since one or more contaminant particle(s) 80A formed on the back side 100 of the wafer 60 are located in between the wafer-holding device 120 and the wafer 60, the wafer 60 is tilted with respect to the wafer-holding device 120. In other words, the wafer 60 is unlevel due to the presence of the contaminant particles 80A formed on the back side 100 of the wafer 60.

It is understood that the wafer 60, the contaminant particle(s) 80A, and the wafer-holding device 120 are not drawn in scale, and that the degree of tilting of the wafer 60 may be exaggerated in FIG. 3.

The tilting of the wafer 60, if left unaddressed, may cause fabrication problems. Therefore, a leveling system (not illustrated) may be used to resolve for the wafer tilting issue. The leveling system does not necessarily remove any of the contaminant particles 80A from the back side 100 of the wafer 60. Rather, the leveling system may have sensors that are operable to detect the presence of the particles 80A on the back side 100 of the wafer 60 and adjust the wafer focus accordingly. Hence, through the detection of the particles 80A, the leveling system can determine how much the wafer 60 is out of focus as a result and consequently generate compensation signals to compensate for the tilting of the wafer 60. Stated differently, though the wafer 60 may still be somewhat tilted, the leveling system will allow the wafer 60 to be correctly-focused through appropriate amount of compensation adjustment, thereby minimizing harmful effects of wafer tilting.

One drawback of existing leveling systems, however, is that they may have a limited particle detection range. For most existing leveling systems, they may function effectively with respect to the detection and subsequent compensation of contaminant particles 80A near a center (or inner) region of the wafer 60. But the existing leveling systems may not be able to detect the contaminant particles formed near an edge region of the wafer 60, and therefore will not be able to provide accurate compensation to account for these edge region contaminant particles.

To illustrate the above point, refer to FIG. 4, a simplified top view of the wafer 60 is provided. The wafer 60 may be virtually divided into a plurality of scan fields 140. Each scan field 140 is a region of the wafer 60 that corresponds to an exposure region as the wafer undergoes a photolithography process. It is understood that each scan field 140 may include a plurality of wafer dies. The scan fields 140 are arranged into a plurality of arrays or grids. During the photolithography process, the wafer 60 may be "stepped through" one field at a time.

As part of the fabrication process, the wafer 60 is loaded into a wafer handling system. The wafer 60 should be aligned with previously-loaded wafers as well as subsequently-loaded wafers for reasons of uniformity and accuracy, assuming these wafers are directed toward the same product. Stated differently, each layer of the wafer 60 should be sufficiently aligned with a corresponding layer of all other wafers loaded into the wafer handling system. This type of wafer-to-wafer alignment may also be referred to as wafer overlay. In order to achieve sufficient overlay, a plurality of alignment marks may be implemented on the wafer 60. For the sake of providing an illustration, alignment marks 200A and 200B are illustrated herein.

According to various embodiments, the alignment marks 200A-200B are formed on the front side of the wafer 60. The alignment marks 200A-200B may be relatively small. For example, the sizes of the alignment marks 200A-200B may each be a few hundred nanometers (nm) or smaller. The alignment marks 200A-200B may also have any one of a plurality of suitable shapes. For example, the shapes may include squares, rectangles, or other polygons. In that regard, the shape, geometry, and relative size of the alignment marks 200A-200B illustrated in FIG. 4 do not necessarily represent or limit the shapes, geometries, and sizes of actual alignment marks on a real world wafer.

In some embodiments, the alignment marks 200A-200B are located on opposite corners of the wafer 60. Each alignment mark 200 may be partially overlapping with one of the scan fields 140. The alignment marks 200A-200B are also located near the edge of the wafer 60. Alternatively stated, the alignment marks 200A-200B are located away from a center region of the wafer 60, such that they are "out of the reach" of the leveling system for wafer tilt compensation discussed above. Thus, if one or more back side contaminant particles 80B are located within (or overlaps with) the alignment marks 200A-200B—such as in the example situation shown in FIG. 4—the presence of these contaminant particles 80A or 80B may not be detected by the leveling system. Consequently, the disposition of the contaminant particles 80B on the alignment marks 200A-200B may result in substantial alignment problems for the wafer 60. For instance, the presence of the back side contaminant particles 80B on the alignment marks 200A-200B may cause the leveling system to produce incorrect compensation signals, thereby over-compensating or under-compensating the amount of wafer tilt. Hence, the wafer may be out of focus during subsequent fabrication stages. Wafer failures may therefore occur.

Note that even if the back side contaminant particles 80 are not located exactly on the alignment marks 200A-200B, they may still interfere with proper alignment between wafers as long as they are out of a detection range of the leveling system. Alternatively stated, contaminant particles 80 disposed near the edge of the back side 100 of the wafer 60 may potentially contribute to misalignment between wafers and as such are undesirable for at least this reason alone.

To overcome the issue caused by back side contaminant particles described above, a wafer back side cleaning apparatus is implemented according to various aspects of the present disclosure. Referring now to FIG. 5, an example simplified block diagram of a back side contaminant particle cleaning apparatus 250 is illustrated according various aspects of the present disclosure. The back side contaminant particle cleaning apparatus 250 is implemented inside a wafer pre-alignment unit 260 of a wafer handling system 270.

The contaminant particle cleaning apparatus 250 includes a mechanical structure 300, a brushing mechanism 310, and an exhaust component 320. The mechanical structure 300 may include a securing mechanism that attaches the contaminant particle cleaning apparatus 250 to the wafer pre-alignment unit 260. The mechanical structure may also include mechanisms that can receive a wafer (e.g., a wafer-holding device) and positionally secure the wafer so that the wafer is steady while being cleaned. In various embodiments, the mechanical structure 300 may include screws, rods, fasteners, crutches, clamps, chucks, or other suitable mechanical devices.

The brushing mechanism 310 may include an anti-electrostatic brush in various embodiments. Such anti-electrostatic brush is operable to brush contaminant particles off of the wafer surface without generating static electricity. This may be advantageous in at least two respects. In one respect, the absence of static electricity reduces the likelihood of causing electrostatic discharge (ESD) damages to the wafer. Stated differently, had static electricity been generated by the brushing of the wafer, the various electronic components on the wafer may suffer from ESD-related damages, as many electronic components are sensitive to ESD. Therefore, since the anti-electrostatic brush does not generate static electricity, ESD damages to the wafer may be avoided during the operation of the wafer cleaning apparatus 250.

In another respect, the presence of static electricity generally causes small contaminant particles to be attracted to (or stick to) the wafer surface. Thus, it would have been difficult to remove the contaminant particles from the wafer surface had a static-electricity-generating brush been used to brush the wafer surface. In comparison, the anti-electrostatic brush may remove the contaminant particles from the wafer surface with relative ease, since substantially no static electricity is produced by the anti-electrostatic brush during the brushing of the wafer.

The brushing mechanism 310 may also include a movable member that is operable to raise or lower the anti-electrostatic brush. This movable member may also be referred to as a brush up/down component. In some embodiments, the movable member is mechanically attached to the anti-electrostatic brush and may be electrically controlled to move the anti-electrostatic brush at programmed times. The anti-electrostatic brush may be moved up and down by a predetermined distance. In certain embodiments, the predetermined distance may be in a range between 0.5 millimeters (mm) and 1 mm. The brushing mechanism 310 may also include a spring that can provide a springing tension to the anti-electrostatic brush, thereby applying a force for the wafer brushing.

The exhaust component 320 is operable to evacuate the contaminant particles once they are brushed off of the wafer surface. In some embodiments, the exhaust component includes a hose or a pipe, through which the contaminant particles may exit the contaminant particle cleaning apparatus 250 (and also the wafer handling system 270). The hose may be coupled to the anti-electrostatic brush so as to collect the brushed-off contaminant particles. The exhaust component 320 may further include a vacuum generator, or alternatively be coupled to a vacuum generator. The vacuum generator can create a pressurized environment inside (and/or near) the exhaust component 320 so as to facilitate the removal of the contaminant particles. For example, the exhaust component 320 may include a fan that can create a suction force to "suck" the loosened contaminant particles into the hose or pipe. In certain embodiments, the exhaust component 320 may have an air flow rate in a range between 2 liters/minute to about 10 liters/minute. It is understood that the exhaust component 320 may also be used to remove moisture from inside the contaminant particle cleaning apparatus 250.

In some embodiments, the exhaust component 320 is activated simultaneously with the brushing mechanism 310. In other words, as the brushing mechanism 310 brushes off the contaminant particles from the back side of the wafer surface, the exhaust component 320 sucks away the brushed-off (or loosened) contaminant particles. In alterative embodiments, it is also contemplated that the exhaust component 320 and the brushing mechanism 310 may be activated at slightly different time slots.

Although FIG. 5 shows the mechanical structure 300, the brushing mechanism 310, and the exhaust component 320 as separate devices, they may be partially or wholly integrated in some embodiments. For example, the brushing mechanism 310 and the exhaust component 320 may be integrated as a single structure in certain embodiments. In addition, the contaminant particle cleaning apparatus 250 may further include other suitable devices or components, but they are not described or illustrated herein for the sake of simplicity.

The wafer handling system 270 may further contain a controller 340. The controller 340 may include one or more computer processors and/or memory components and may store and execute software program instructions. The controller 340 may be operable to govern the functioning of the various components of the wafer handling system 270, for instance the operation of the wafer pre-alignment unit 260. As an example, the controller 340 may be programmed to activate the contaminant particle cleaning apparatus 250 so that the brushing mechanism 310 begins brushing a wafer at a predetermined time. It is understood that the controller 340 may also contain one or more appropriate sensors, such as voltage sensors, current sensors, vibration sensors, temperature sensors, levelness sensors, moisture sensors, position sensors, accelerometer sensors, etc. These sensors may be utilized to guide or assist the operation of the controller 340. In some embodiments, one or more of these sensors may also be implemented outside the controller 340 but communicatively coupled to the controller 340.

Though the embodiment in FIG. 5 shows the controller 340 as a part of the wafer handling system 270, it is understood that the controller 340 or a similar controlling mechanism may be implemented outside the wafer handling system 270. Alternatively, the controller 340 may also be implemented inside (or as a part of) the wafer pre-alignment unit 260 in some embodiments, or even inside (or as a part of) the contaminant particle cleaning apparatus 250 in other embodiments. In other words, the location of the controller 340 is not critical and may change from embodiment to embodiment.

FIG. 6 is a diagrammatic three-dimension perspective view of a portion of a contaminant particle cleaning apparatus 250A that is an embodiment of the contaminant particle cleaning apparatus 250 of FIG. 5. The contaminant particle cleaning apparatus 250A is operable to hold the wafer 60. The back side 100 of the wafer 60 is facing toward the rest of the contaminant particle cleaning apparatus 250A. The contaminant particle cleaning apparatus 250A includes a brush crutch mechanism 350 as part of the mechanical structure 300 of FIG. 5. The brush crutch mechanism 350 is coupled to a brush module 360, which has both the brushing mechanism 310 and the exhaust component 320 of FIG. 5 integrated therein. In some embodiments, the brush crutch mechanism 350 may assist the raising and the lowering of the brush module 360 relative to the wafer 60.

As the wafer 60 spins, the brush module 360 is operable to brush off contaminant particles from the back side 100 of the wafer 60. In various embodiments, the brush module 360 is used to brush an edge region of the wafer 60, since contaminant particles located near the edge region causes significantly more problems than contaminant particles located near the center of the wafer 60. As discussed above with reference to FIG. 5, the brush module 360 may employ an anti-electrostatic brush to remove the contaminant particles without producing static electricity. Meanwhile, as the contaminant particles are brushed off the wafer 60, they are collected by the exhaust component located on the brush module 360. These contaminant particles may then be discarded later.

Although not illustrated for reasons of simplicity and clarity, it is understood that the wafer cleaning apparatus 250A is implemented within a wafer pre-alignment unit, which is a part of a wafer handling system. It is also understood that an electronic controller (also not illustrated) may be used to govern the operation of the wafer cleaning apparatus 250A. In some embodiments, a human operator may replace or supplement the functions of the electronic controller. Also, the shapes and configurations of the various components of the wafer cleaning apparatus 250A illustrated herein are purely examples, and they may be altered in other embodiments for account for designs concerns and manufacturing requirements.

FIG. 7 is a simplified diagrammatic top view of the wafer 60 provided to illustrate the operation of the wafer cleaning apparatus 250. The wafer 60 includes alignment marks 200A and 200B located on opposite corners of the wafer 60. Contaminant particles 80B may be located within or partially overlapping with the alignment marks 200A-200B.

The alignment marks 200A-200B and the contaminant particles 80B are positioned within a wafer cleaning region 380. The wafer cleaning region 380 represents the effective region on the back side of the wafer 60 that can be cleaned by the wafer cleaning apparatus 250. In some embodiments, the wafer cleaning region 380 is the cleaning path of the anti-electrostatic brush as the wafer 60 is spun. Thus, the wafer cleaning region 380 has an annular ring shape in the illustrated embodiment. Stated differently, the annular ring shaped wafer cleaning region 380 may be viewed as the difference between two concentric circles having a radius R1 (inner circle) and R2 (outer circle), respectively. The circle having the radius R1 extends to the inner edge of the wafer cleaning region 380, and the circle having the radius R2 extends to the outer edge of the wafer cleaning region 380. In some embodiments, the radius R1 is in a range from about 70 mm to about 90 mm, and the radius R2 is in a range from about 90 mm to about 110 mm. Of course, it is understood that R1 and R2 may vary depending on the size of the wafer.

The wafer cleaning region 380 has a width 390. The width 390 represents the length of the brush used to clean the back side of the wafer. The width 390 is the difference between the radii R2 and R1 in the illustrated embodiment, meaning width $390=R2-R1$. The width 390 may be carefully chosen so that it is neither too big nor too small. If the width 390 is too big, then the corresponding brushing mechanism (and hence the wafer cleaning apparatus) may not be easily installed or implemented within the wafer pre-alignment unit. In other words, there may be practical space-related constraints on the upper limit of the width 390. On the other hand, if the width 390 is too small, then it may not be able to effectively clean the wafer 60, since it may miss some contaminant particles 80 located near the edge of the wafer 60, where the contaminant particles 80 are also undetectable by the leveling system. In other words, these contaminant particles 80 may not be effectively removed by the wafer cleaning apparatus and thus may still cause alignment problems. As such, the width 390 (i.e., length of the brush) of the wafer cleaning region is carefully configured after taking various tradeoffs into consideration. In some embodiments, the width 390 is in a range from about 15 mm to about 25 mm.

Note that the wafer cleaning region 380 is also spaced apart from an outer rim 395 of the wafer 60 by a distance 400. The distance 400 is sufficiently great to ensure that the brush of the wafer cleaning apparatus will not accidently brush the outer rim of the wafer 60. This is because the brushing of the outer rim 395 (whether accidental or intentional) of the wafer 60 may result in scratching of the front side of the wafer 60 as well, which can damage semiconductor devices formed on the front side of the wafer 60. Thus, the distance 400 is intentionally reserved to prevent scratching of the front side of the wafer 60. In some embodiments, the distance 400 is in a range from about 2 mm to about 3 mm.

As illustrated in FIG. 7, the configuration of the wafer cleaning apparatus herein allows contaminant particles 80B to be effectively removed so that they are no longer located within the edge region of the wafer 60 or interfering with the alignment marks 200A-200B. In accordance with various aspects of the present disclosure, these back side contaminant particles 80B may be brushed off the back side of the wafer 60 using a brushing mechanism and then be sucked away by an exhaust component. Consequently, the leveling system will not produce incorrect compensation signals to adjust the focus of the wafer 60. Therefore, wafer yield and quality may be improved.

It is understood that the implementations of the various devices disclosed herein are merely examples and are not intended to be limiting. Other implementations may be used in alternative embodiments as long as they are consistent with the spirit and the scope of the present disclosure. For example, although a brushing mechanism or technique is used to clean the back side of the wafer surface, other techniques such as air purge, vapor clean, or ultrasonic shock may be used instead in alternative embodiments.

The fabrication apparatuses and techniques according to various aspects of the present disclosure offer advantages over existing fabrication apparatuses and techniques. It is understood, however, that not all advantages are necessarily discussed herein for reasons of simplicity, and other embodiments of the present disclosure may offer additional advantages, and that no particular advantage is required for all embodiments.

One advantage is that the embodiments disclosed herein allow the contaminant particles located on the back side of a wafer to be cleaned, particularly the contaminant particles located near the edge of the wafer. As discussed above, the contaminant particles located on the back side of the wafer tend to cause alignment problems, especially if these particles are overlapping with alignment marks. Existing fabrication systems often lack effective tools and methods to remove these contaminant particles disposed near the edge on the back side of the wafer. According to various aspects of the present disclosure, however, a versatile and compact wafer cleaning apparatus may be used to effectively and efficiently remove the particles formed on the back side of the wafer, particularly the particles near the edge of the wafer. As such, wafer alignment may be significantly improved.

Another advantage is that the implementation of the wafer cleaning apparatus disclosed herein is simple and can be integrated within current fabrication tools. For example, the wafer cleaning apparatus can easily be installed within the wafer pre-alignment unit that is currently available and widely used in semiconductor fabrication. Hence, the wafer cleaning apparatus consumes no additional space, nor does it require numerous other costly components. As such, the implementation of the wafer cleaning apparatus is simple, inexpensive, and compatible with existing fabrication processes. Further, once the wafer cleaning apparatus is installed, it can remain installed for a long period of time without needing servicing.

One of the broader forms of the present disclosure involves an apparatus for fabricating a semiconductor device. The apparatus includes: a mechanical structure that is operable to secure a position of a semiconductor wafer, the wafer having a front surface and a back surface; and a wafer cleaning device that is operable to clean a predetermined region of the wafer on the back surface, wherein the predetermined region of the wafer at least partially overlaps with one or more alignment marks.

In some embodiments, the apparatus is a component of a wafer handling system.

In some embodiments, the apparatus is installed within a wafer pre-alignment unit of the wafer handling system.

In some embodiments, the wafer cleaning device includes a brush operable to brush contaminant particles off of the predetermined region of the wafer on the back surface without generating static electricity.

In some embodiments, the wafer cleaning device includes an exhaust component operable to collect and dispose of wafer particles brushed off by the brush.

In some embodiments, the predetermined region of the wafer is located near an edge of the wafer.

In some embodiments, the predetermined region of the wafer has an annular ring shape.

In some embodiments, the predetermined region of the wafer is spaced apart from an outer rim of the wafer by a predetermined distance.

Another one of the broader forms of the present disclosure involves a semiconductor fabrication system. The system includes: a wafer handling system that includes a wafer pre-alignment unit; and a wafer cleaning mechanism installed within the wafer pre-alignment unit, the wafer cleaning mechanism being operable to clean an edge region of a semiconductor wafer from a back side of the wafer, wherein the wafer cleaning mechanism includes: a brush operable to brush contaminant particles off of the edge region of the back side of the wafer; and an exhaust component operable to gather the brushed-off contaminant particles.

In some embodiments, the wafer has one or more alignment marks located in the edge region of the wafer.

In some embodiments, the brush is operable to brush the wafer as the wafer is spun, thereby creating a cleaning path on the wafer, and wherein the one or more alignment overlaps with the cleaning path.

In some embodiments, the cleaning path is shaped like an annular ring having a ring width substantially equal to a length of the brush.

In some embodiments, the cleaning path is separated from an outer rim of the wafer by a predetermined distance.

In some embodiments, the brush includes an anti-electrostatic brush.

In some embodiments, the exhaust component includes a pipe and a vacuum generator.

Yet another one of the broader forms of the present disclosure involves a method of fabricating a semiconductor device. The method includes: loading a semiconductor wafer into a wafer handling system, the semiconductor wafer having a front side and a back side and one or more alignment marks; removing contaminant particles from an edge region of the wafer from the back side, wherein the one or more alignment marks are located in the edge region; and collecting the removed contaminant particles and discarding the collected contaminant particles out of the wafer handling system.

In some embodiments, the loading the wafer includes loading the wafer into a wafer pre-alignment unit of the wafer handling system.

In some embodiments, the removing includes brushing the edge region using an anti-electrostatic brush while the wafer is being spun.

In some embodiments, the collecting includes sucking the removed contaminant particles into a pipe.

In some embodiments, the edge region of the wafer is shaped as an annular ring having a predetermined width, and wherein an outer boundary of the annular ring is spaced apart from an outer rim of the wafer by a predetermined distance.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    loading a semiconductor wafer into a wafer handling system, the semiconductor wafer having a front side and a back side and having an outer rim, an inner region, and an outer region, wherein one or more alignment marks are positioned in an outer region of the wafer's front side, wherein the outer region is shaped an as annular ring having a predetermined width, wherein an outer boundary of the annular ring is spaced apart from the outer rim of the wafer by a distance in a range of about 2 mm to about 3 mm;
    removing, with a brush, contaminant particles in the outer region of the wafer's back side without brushing the outer rim and without brushing the inner region, such that the brush is passed over the outer region on the back side of the wafer;
    holding the brush against the back side of the wafer with tension provided by a spring; and
    collecting the removed contaminant particles and discarding the collected contaminant particles out of the wafer handling system.

2. The method of claim 1, wherein the loading the wafer includes loading the wafer into a wafer pre-alignment unit of the wafer handling system.

3. The method of claim 1, wherein the removing includes brushing the outer region using an anti-electrostatic brush while the wafer is being spun.

4. The method of claim 1, wherein the collecting includes sucking the removed contaminant particles into a pipe coupled to the brush.

5. The method of claim 1, wherein the predetermined width is in a range from about 15 mm to about 25 mm.

6. The method of claim 1, wherein collecting the contaminant particles comprises utilizing an exhaust component having an air flow rate in a range between about two liters/minute and about 10 liters/minute.

7. The method of claim 6, further comprising removing moisture from inside the wafer handling system via the exhaust component.

8. A method of fabricating a semiconductor device, comprising:
    loading a semiconductor wafer into a contaminant particle cleaning apparatus of a wafer handling system, the semiconductor wafer having a front side and a back side and one or more alignment marks located in an outer region of the semiconductor wafer;
    spinning the wafer about a central axis within the contaminant particle cleaning apparatus;
    placing an anti-electrostatic brush against the semiconductor wafer with tension provided by a spring;
    brushing the outer region of the wafer with the anti-electrostatic brush to remove contaminant particles from the outer region of the wafer from the back side without brushing an outer rim of the wafer and without brushing an inner region of the wafer, wherein the outer region is shaped as an annular ring having a predetermined width, wherein an outer boundary of the annular ring is spaced apart from the outer rim of the wafer by a distance in a range of about 2 mm to about 3 mm; and
    collecting the removed contaminant particles and discarding the collected contaminant particles out of the wafer handling system.

9. The method of claim 8, further comprising raising a brush crutch mechanism to place the brush in contact with the back side of the semiconductor wafer.

10. The method of claim 9, wherein raising the brush crutch mechanism to place the brush in contact with the back side of the semiconductor wafer also raises an exhaust component into position proximate the back side of the semiconductor wafer.

11. The method of claim 10, wherein collecting the removed contaminant particles comprises activating an exhaust component that evacuates contaminant particles after the contaminant particles are brushed off the back side of the semiconductor wafer by the brush.

12. The method of claim 8, wherein the outer region of the wafer is shaped as an annular ring, and wherein an outer boundary of the annular ring is spaced apart from the outer rim of the wafer.

13. The method of claim 12, wherein the predetermined width of the annular ring is in a range from about 15 mm to about 25 mm.

14. A method of fabricating a semiconductor device, comprising:
    spinning a semiconductor wafer having a front side and a back side and one or more alignment marks on the front side of the semiconductor wafer about a central axis of a wafer particle cleaning apparatus;
    adjusting an elevation of an anti-electrostatic brush relative to the wafer with an electronically controlled brush up/down component to brush an annular region of the wafer with the anti-electrostatic brush to remove contaminant particles from the back side, wherein an outer boundary of the annular region is spaced apart from an outer rim of the wafer by a distance in a range of about 2 mm to 3 mm; and
    collecting the removed contaminant particles as the removed contaminant particles are brushed off the back side of the wafer in the annular region, without brushing a portion of the back side adjacent to the outer rim and without brushing an inner region of the wafer extending from a center of the wafer to an inner boundary of the annular region.

15. The method of claim 14, wherein a width of the annular region is in a range from about 15 mm to about 25 mm.

16. The method of claim 14, wherein adjusting the elevation of the anti-electrostatic brush further comprising adjusting an elevation of an exhaust component utilized to collected the removed contaminant particles.

17. The method of claim 14, wherein the one or more alignment marks is directly opposite to an outer portion of the annular region on the back side of the wafer.

18. The method of claim 1, wherein the inner region extends from a center of the semiconductor wafer to an inner border of the outer region.

19. The method of claim 14, further comprising adjusting the elevation of the anti-electrostatic brush by a distance in a range between 0.5 mm and 1 mm during cleaning.

20. The method of claim 14, further comprising using electrical controls to adjust the elevation of the anti-electrostatic brush at programmed times.

* * * * *